United States Patent [19]

Kose et al.

[11] Patent Number: 4,760,338

[45] Date of Patent: Jul. 26, 1988

[54] MAGNETIC RESONANCE IMAGING APPARATUS AND METHOD UTILIZING A COMPOSITE RF PULSE

[75] Inventors: Katzumi Kose, Tokyo; Kozo Satoh, Yokohama, both of Japan

[73] Assignee: Kabushiki Kaisha Toshiba, Kawasaki, Japan

[21] Appl. No.: 878,783

[22] Filed: Jun. 26, 1986

[30] Foreign Application Priority Data

Jun. 29, 1985 [JP] Japan .................................. 60-143722

[51] Int. Cl.[4] ........................................... G01R 33/20
[52] U.S. Cl. ..................................... 324/309; 324/307
[58] Field of Search ............... 324/309, 314, 300, 307, 324/310, 311, 312

[56] References Cited

U.S. PATENT DOCUMENTS

| 4,564,813 | 1/1986 | Young et al. ...................... 324/309 |
| 4,613,949 | 9/1986 | Glover et al. ...................... 374/309 |
| 4,656,424 | 4/1987 | Tsur et al. .......................... 324/314 |

Primary Examiner—Stewart J. Levy
Assistant Examiner—Louis M. Arana
Attorney, Agent, or Firm—Oblon, Fisher, Spivak, McClelland & Maier

[57] ABSTRACT

In an imaging apparatus and a method for producing a two-dimensional image of an object under medical examination, a composite selective RF pulse is produced in a transmitter unit. The composite selective RF pulse is constituted of a second RF 90° pulse and a third RF 90° pulse. Under the control of a system processor, the second RF 90° pulse is firstly applied to the object and the third RF 90° pulse is secondly applied thereto under the same polarity of the field gradient after providing an time interval.

6 Claims, 12 Drawing Sheets

FIG. 1
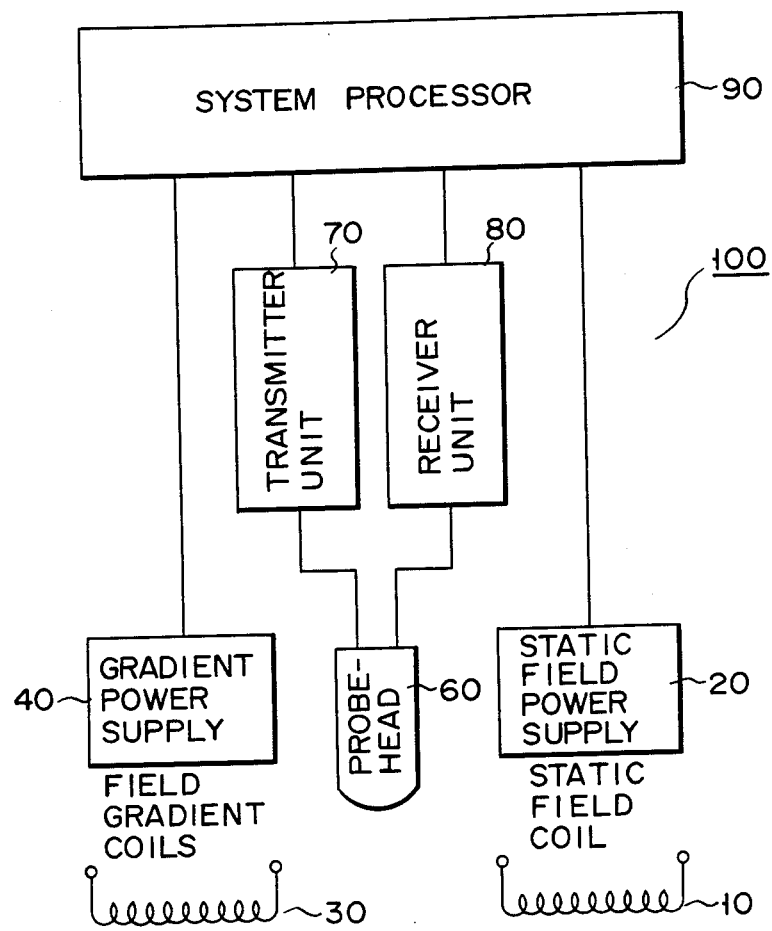
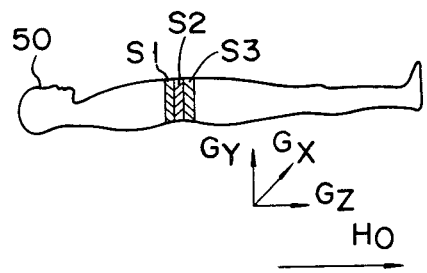

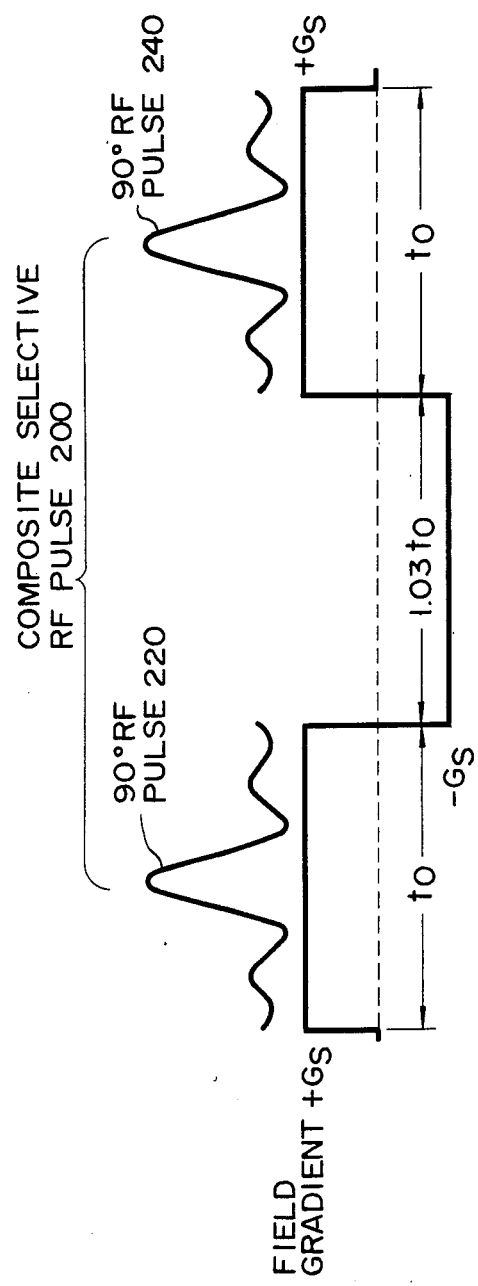

F I G. 3B
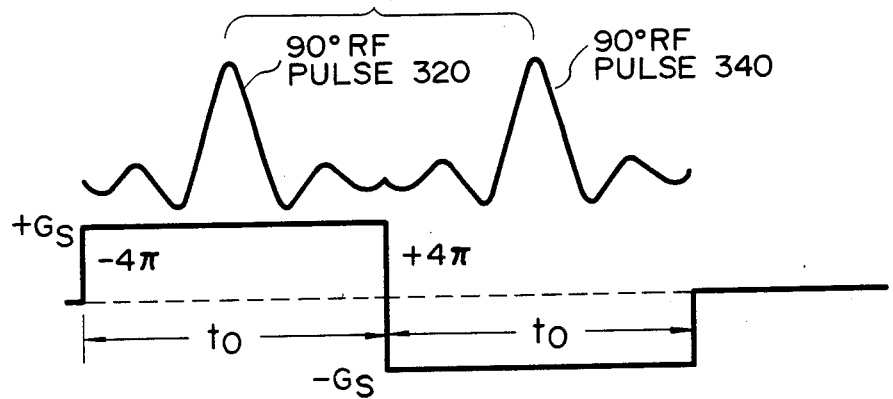

MAGNETIC RESONANCE IMAGING APPARATUS AND METHOD UTILIZING A COMPOSITE RF PULSE

BACKGROUND OF THE INVENTION

1. Field of the Invention

The invention relates to a magnetic resonance imaging apparatus and a method for producing a tomogram of an object under medical examination by applying composite RF signals to the object, thereby causing a nuclear magnetic resonance phenomenon so-called "NMR" phenomenon.

2. Description of the Prior Art

In a conventional computerized NMR tomographic apparatus for medical purposes, the so-called multi-slice method is usually employed to improve diagnostic efficiency per unit time. In this method, magnetization or spinning magnets of a large number of slices are excited by a time-division technique to perform signal acquisition, utilizing the waiting time of the magnetization recovery after excitation or inversion of a single slice. More specifically, a linear magnetic field gradient in the direction perpendicular to a specific slice is applied to an object placed in a uniform static magnetic field, and a resonance frequency is linearly changed along this direction. Under this condition RF (radio frequency) pulses having a bandwidth corresponding to slice thickness with a resonance frequency as a center frequency are sequentially applied to the object to excite and invert magnetization, and to perform echo signal convergence. The actual data acquisition involves the following two methods. To achieve echo signal convergence, magnetization of a specific slice is first inverted and thereafter excited. For the same purpose, the magnetization is excited without magnetization inversion. The magnetization is rotated by 90° with a so-called "selective 90° RF pulse," and is inverted, or converged by a so-called "selective 180° RF pulse."

Such a conventional NMR imaging apparatus is disclosed in U.S. Pat. No. 4,484,138 to Bottomley et al.

The excitation and inversion of the magnetization, and the echo signal convergence act only on a specific region of the object and do not influence the magnetization occurring outside this region at all. This is an ideal condition, not an actual condition. To reduce the adverse influence of the magnetization of the slices adjacent to the specific slice, a comparatively large interval between the adjacent slices must be introduced. If such a broad interval is employed between the adjacent slices, the NMR signal acquisition about these slices located in this interval may fail. In practice, it is difficult for a selective 180° RF pulse to uniformly invert the magnetization in the specific region. The inversion recovery image of the excited specific region can hardly have higher quality.

An object of the invention is to provide a magnetic resonance imaging apparatus and a method by which the interval between an excited slice of an object and an adjacent slice thereof can be reduced as shortly as permitted by using a composite 180° pulse in conjunction with an appropriately controlled field gradient.

Another object of the invention is to provide a magnetic resonance imaging apparatus which can reconstruct a high-quality inversion image of the specific slice of an object by applying a specific composite RF pulse to the object. A still further object of the invention is to provide a magnetic resonance imaging apparatus by which multi-slice inversion images of the specific slices can be produced without a gap between the successive slices.

SUMMARY OF THE INVENTION

These and other objects can be accomplished by providing a magnetic resonance imaging apparatus for producing a two-dimensional image of an object under medical examination by nuclear magnetic resonance comprising:

first field means for applying a static magnetic field to said object;

second field means for applying to said object a first magnetic field gradient that in conjunction with said static magnetic field, defines a slice of said object, and for applying to said slice a second magnetic field gradient so as to give positional information on nuclear magnetic resonance signals;

means for producing a first 90° RF (radio frequency) pulse and a composite selective RF pulse as a series of radio frequency (RF) pulses;

probe head coil means for applying said series of RF pulses to at least said slice so as to excite specified nuclei therein, and for detecting the nuclear magnetic resonance signals derived from said slice, and means for controlling application sequence of said series of RF pulses so as to apply said composite selective RF pulse after said first 90° RF pulse has been applied to said slice, and for reconstructing the twodimensional image of the spatial distribution of the specified nuclei within said slice.

Furthermore, a method for imaging a two dimensional image of an object under medical examination by nuclear magnetic resonance comprises steps of;

applying a static magnetic field to said object;

applying to said object a first magnetic field gradient that, in conjunction with said static magnetic field, defines a slice of said object, and applying to said slice a second magnetic field gradient for giving positional information on nuclear magnetic resonance signals;

producing a first 90° RF (radio frequency) pulse and a composite selective RF pulse as a series of radio frequency (RF) pulses;

applying said series of RF pulses to at least said slice so as to excite specified nuclei therein, and detecting the nuclear magnetic resonance signals derived from said slice; and controlling application sequence of said series of RF pulses so as to apply said composite selective RF pulse after said first 90° RF pulse has been applied to said slice, and reconstructing the two dimensional image of the spatial distribution of the specified nuclei within said slice.

BRIEF DESCRIPTION OF THE DRAWINGS

These objects and features of the invention will become apparent with reference to the following specification and to the drawings in which:

FIG. 1 is a schematic block diagram of a magnetic resonance imaging apparatus according to one preferred embodiment of the invention;

FIG. 2 illustrates a composite RF pulse in conjunction with a magnetic field gradient produced by the imaging apparatus shown in FIG. 1;

FIG. 3B illustrates the waveform of another composite RF pulse, and the relationship of the pulse with a magnetic field gradient produced by the imaging apparatus of FIG. 1;

DETAILED DESCRIPTION OF THE PREFERRED EMBODIMENTS

Figure 3A:
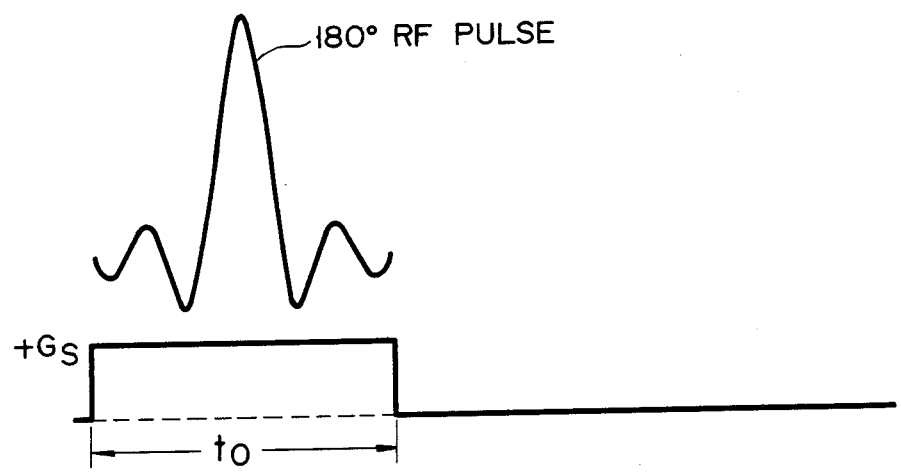
FIG. 3A illustrates the waveform of the conventional 180° RF pulse.

Before explaining various embodiments of the invention, the basic operations of the invention will now be described.

In the first basic operation, a composite RF pulse, i.e., a combination of two consecutive selective 90° RF pulses, is applied to a specific slice for performing the spin inversion or echo signal convergence after a normal 90° RF pulse or selective 90° pulse has been applied thereto. More particularly, a first selective 90° RF pulse is applied to the slice under a magnetic field gradient having one polarity, and the polarity of the magnetic field gradient is immediately inverted. After a predetermined period of time, the inverted magnetic field gradient is re-inverted back to the same polarity as the magnetic field gradient when the first pulse is applied. The second selective 90° RF pulse is then applied to the same slice.

According to a second principle of operation, after the normal 90° RF pulse is applied to the specific slice, the first selective 90° RF pulse is applied thereto under a magnetic field gradient having one polarity. Immediately after, the polarity of the magnetic field gradient is inverted, and the second selective 90° RF pulse is applied to the slice, to obtain echo signals.

ARRANGEMENT OF NMR IMAGING APPARATUS

FIG. 1 is a schematic block diagram of magnetic resonance imaging apparatus 100 according to an embodiment of the present invention. Apparatus 100 includes static field coil 10, static field power supply 20, magnetic field gradient coils 30 and gradient power supply 40. These components cooperate to apply a static magnetic field to object 50 under medical examination, uniform along a longitudinal axis of object 50 (i.e., an axis parallel to the Z-axis), and a magnetic gradient field, the strength of which changes linearly along a direction perpendicular to a specific slice plane in the object 50. Apparatus 100 further includes probe head 60 for applying pulses to object 50, acquiring echoes from the excited spinning nuclei in the slice plane, and converting the echoes into echo signals; transmitter unit 70 for modulating an RF signal to, for example, a phase and amplitude modulated signal; receiver unit 80 for receiving and detecting the echo signals; and system controller 90 for controlling the operations of the overall system.

The arrangement in FIG. 1 will be described in more detail.

As is well known, the static magnetic field $H_0$ from coil 10 has spatially uniform field strength along a direction parallel to a longitudinal axis of an object 50 such as a patient, i.e., the Z-axis. Coils 30 generate magnetic field gradients $G_X$, $G_Y$ and $G_Z$ extending along the X, Y and Z directions, respectively, i.e., in directions orthogonal to each other (see FIG. 1). The strengths of these gradient fields are 0 at the origin of the coordinate system and increase linearly along the respective axes.

It is understood that a field gradient $G_S$ is obtained by vector-synthesizing the field gradients $G_X$, $G_Y$ and $G_Z$, and referred to as "a slicing field gradient $G_S$".

The slicing field gradient $G_S$ and the frequency of the exciting RF pulses can determine a slice position and a direction of slice plane S2 of object 50 in the X-Y-Z coordinate system. The slice plane S2 is defined as a specific slice to be excited, and slices S1 and S3 adjacent thereto are defined as adjoining slices in this embodiment. Although the intervals between the slice planes S1 and S2; and S2 and S3 are not illustrated, they are practically present. However, these intervals can be reduced as much as possible according to the invention.

Other components such as a couch or the like for placing object 50 thereon are omitted.

With this arrangement, uniform static field $H_0$ and linear magnetic field gradients $G_X$, $G_Y$ and $G_Z$ are applied to object 50. Under this condition, a composite selective RF 180° pulse (to be described below) is applied to perform inversion, excitation, and echo signal convergence of the slice plane S2 of interest.

FIG. 2 shows composite selective RF pulse 200 for performing the magnetization inversion and the echo signal convergence in apparatus 100 of FIG. 1. This composite selective RF pulse 200 consists of a first selective 90° RF pulse 220 and a second selective 90° RF pulse 240.

First selective 90° RF pulse 220 is applied to object 50 while gradient $G_S$ of one polarity is applied thereto. Immediately thereafter, the polarity of gradient $G_S$ is inverted, and is then inverted again after a predetermined period of time (1.03 to). Thereafter, second selective 90° RF pulse 240 is applied, thus achieving composite RF pulse irradiation according to the invention.

Composite selective RF pulse 200 is used in place of the conventional 180° RF pulse. When pulses 220 and 240 are applied to object 50 with a predetermined time interval (1.30 to) set therebetween, advantages better than those provided by the conventional 180° RF pulse can be obtained. Composite RF pulse 200 is generated by transmitter unit 70 under the control of system processor 90. The predetermined time interval is preferably 1.03 times the duration time of pulses 220 and 240. A selection of the predetermined time interval will be described later.

COMPOSITE RF PULSE

The reasons why magnetization inversion and echo signal convergence characteristics can be improved by such a composite pulse 200 and why composite pulse 200 is suitable for the multi-slice method will be described hereinafter.

FIG. 3A shows the conventional selective 180° RF pulse, and FIG. 3B shows a composite pulse proposed as a first example for composite pulse 300. Pulse 300 is also generated by unit 70 under the control of processor 90.

It should be noted that the form of the composite RF pulse 300 and the pulse irradiation conditions thereof toward an object are completely different from those of the composite RF pulse 200 shown in FIG. 2.

When two selective 90° RF pulses 320 and 340 are applied to a slice of an object while the polarity of gradient $G_S$ is inverted, as shown in FIG. 3B, magnetization inversion of nuclei in the slice can apparently be performed in the same manner as the selective 180° RF pulse in FIG. 3A.

A sample or object (not shown in detail) having a uniform density distribution along the Z direction is placed within uniform static field $H_0$ (parallel to the Z-axis). Assume that sample slices perpendicular to the Z-axis, e.g., slice S1, S2 or S3 in FIG. 1, are selectively subjected to excitation, inversion and echo signal convergence. To describe the spin motion, a rotating coordinate system (X', Y' and Z'; the Z'-axis being parallel to the Z-axis) is introduced, the angular frequency of which is $\omega_0 = \gamma H_0$ (where $\gamma$ is a gyromagnetic ratio). An influence of a magnetic relaxation time during the process should be negligible. The magnetization motion is described by Bloch's phenomenological equations, when an RF pulse is applied to object 50 under vector-synthesized magnetic field gradient $G_S$:

$$dm_{X'}/dt = \Delta\omega(Z) m_{Y'} \quad (1)$$

$$dm_{Y'}/dt = -\Delta\omega(Z) m_{X'} + \omega_1(t) m_{Z'} \quad (2)$$

$$dm_{Z'}/dt = \omega_1(t) m_{Y'} \quad (3)$$

where mX', mY' and mZ' are X', Y' and Z' components of magnetization vector, $\Delta\omega(Z)$ is the offset field in the linear magnetic field gradient, and $\omega_1(t)$ is the RF field applied along the X' direction. The offset and RF fields are expressed by using angular frequencies.

Figure 4:
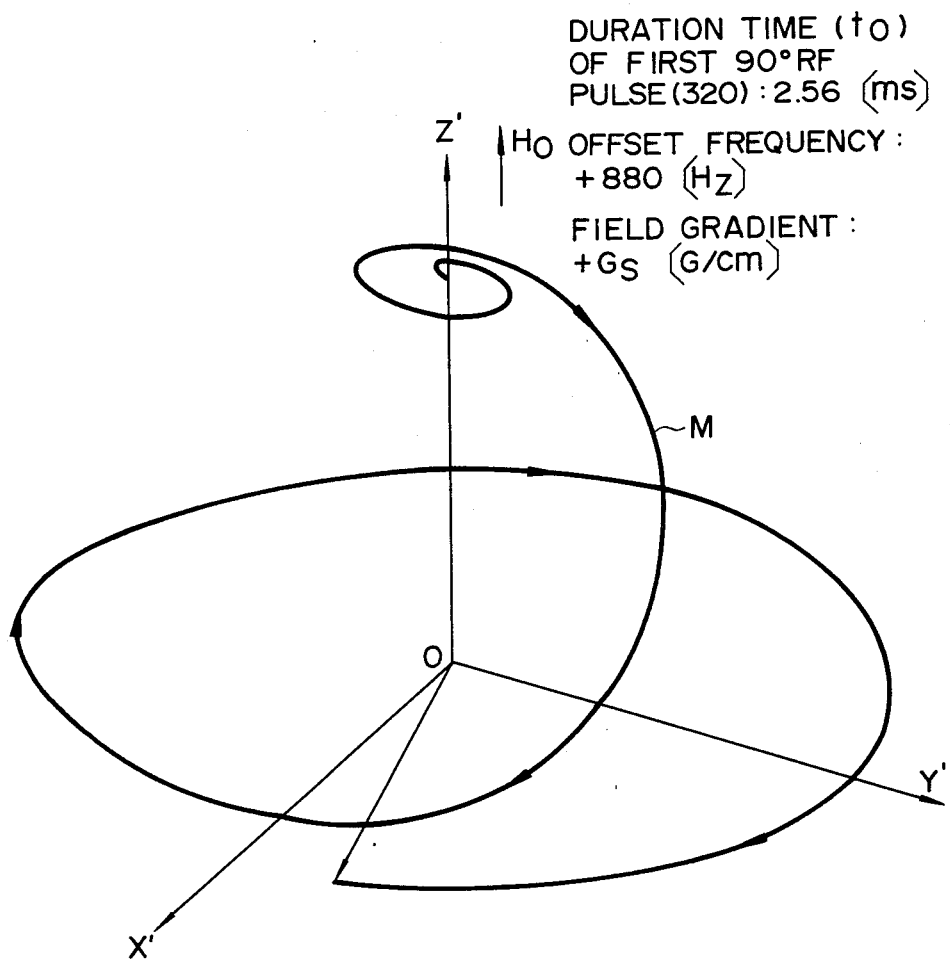
FIGS. 4 to 7 illustrate how excited magnetization acts when the composite RF pulse is applied.

FIG. 4 shows an example of the trajectory of magnetization vector M when first selective 90° RF pulse 320 in FIG. 3B is applied to magnetization vector M with a uniform distribution along the Z direction. Pulse 320 is obtained by amplitude-modulating an $\omega_0$ RF signal with sinX/X wherein X falls within the range between $-4\pi$ (radians) to $4\pi$ (radians). Total duration time "tn" of the pulse is 2.56 msec. In this example, the offset frequency by gradient $+G_S$ is about +880 Hz.

Figure 5:
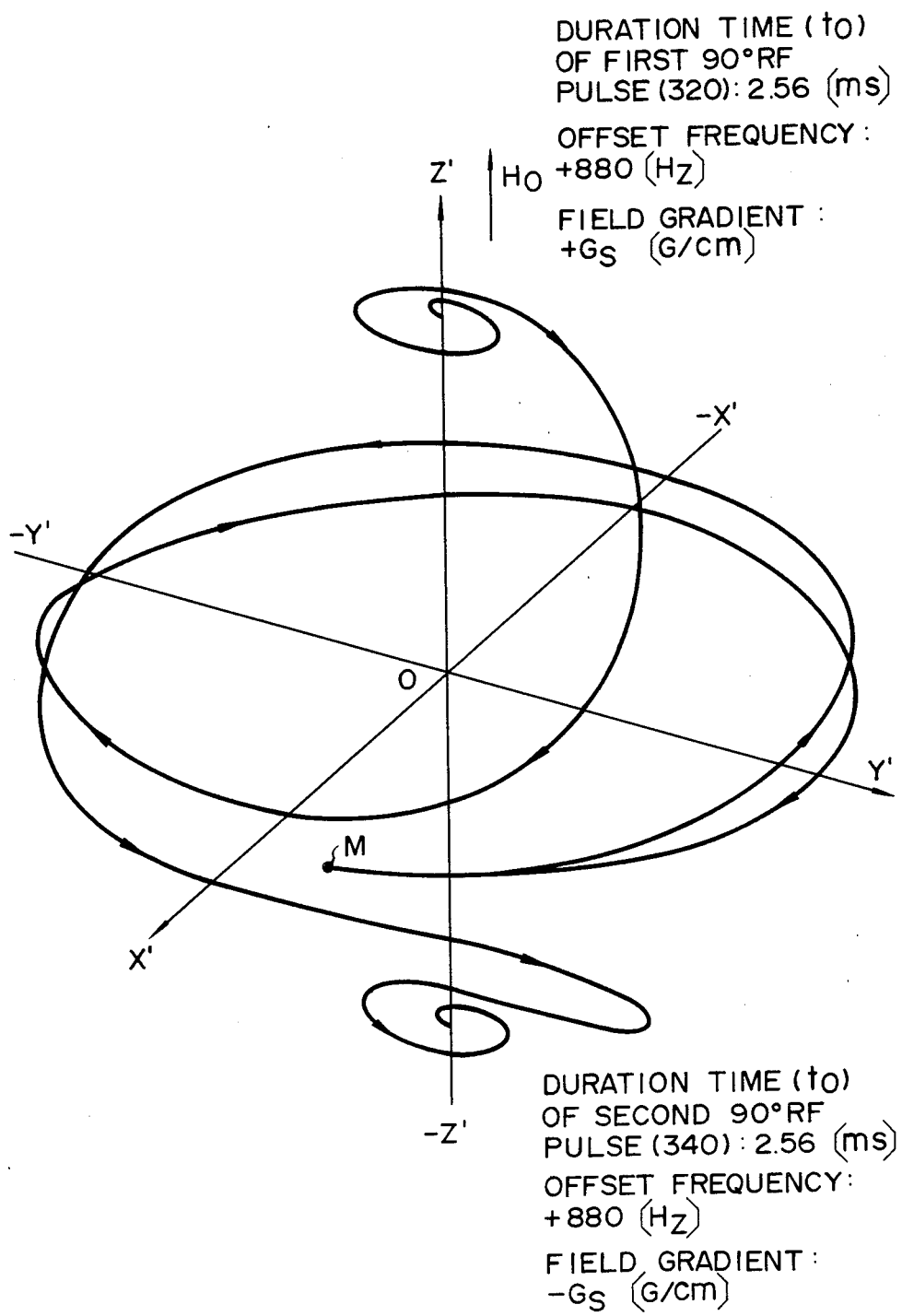

If a peak time of second selective 90° RF pulse 340 is defined as t=0, and t, $\Delta\omega(Z)$ and $m_{Z'}$ given in equations (1) to to (3) are respectively substituted by $-t$, $-\Delta\omega(Z)$ and $-m_{Z'}$, then equations (1) to (3) are valid because $\omega_1(t)$ is equal to $\omega_1(-t)$. In other words, magnetization vector M present on the X'-Y' plane upon application of first 90° pulse 320 is subjected to a process symmetrical with that in FIG. 4 and is thus inverted toward the $-Z'$-axis upon inversion of gradient $+G_S$ and application of second 90° pulse 340. FIG. 5 shows a track of the motion of the magnetization vector M. The offset frequency by gradient $-G_S$ is 880 Hz. Even if magnetization vector M is not present in the X'-Y' plane immediately after second 90° pulse 320 is applied to the object, the same effect as described above can be expected if deviations in the magnetization vector M from the X'-Y' plane are small.

The composite pulse 300 in FIG. 3B serves as the selective 180° RF pulse for the plane of Z=0. However, this effect cannot be expected for other planes, i.e., any plane other than the above-described plane. In other words, the composite pulse in FIG. 3B cannot be directly utilized in the multi-slice method. Thus, according to the present invention, other selective 90° RF pulses (i.e., another composite selective 180° RF pulse 200) are created.

COMPOSITE RF PULSE SUITABLE FOR MULTI-SLICE METHOD

Figure 6:
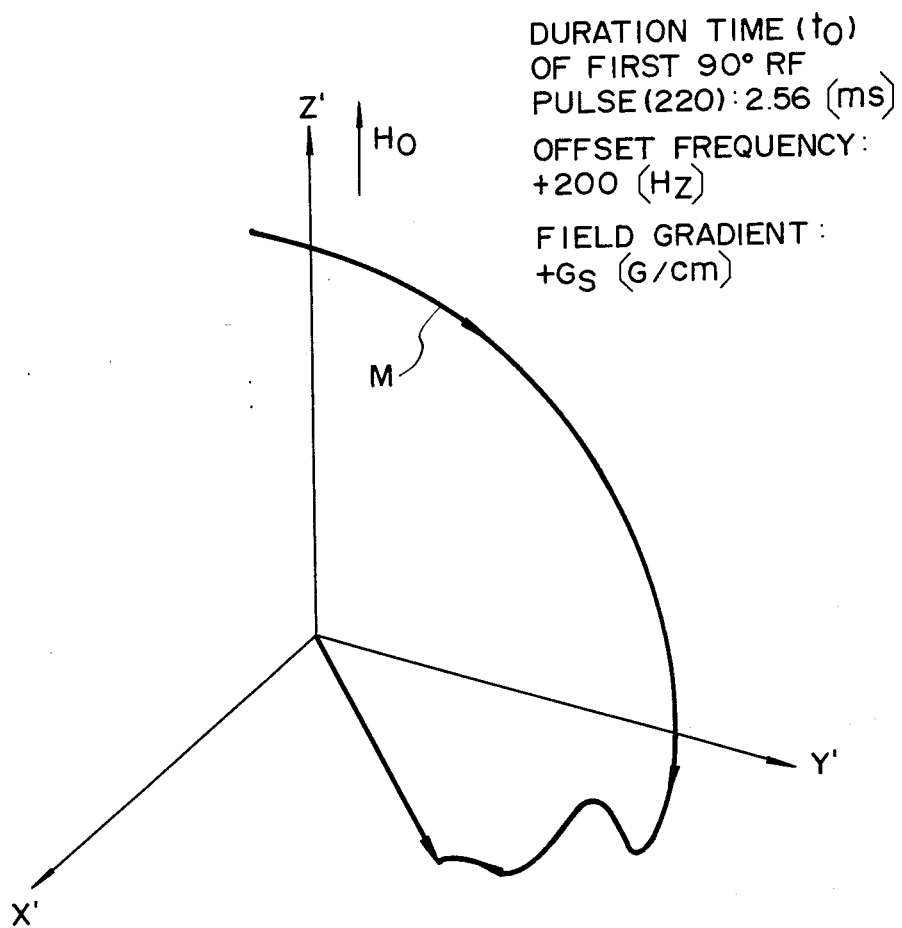
Figure 7:
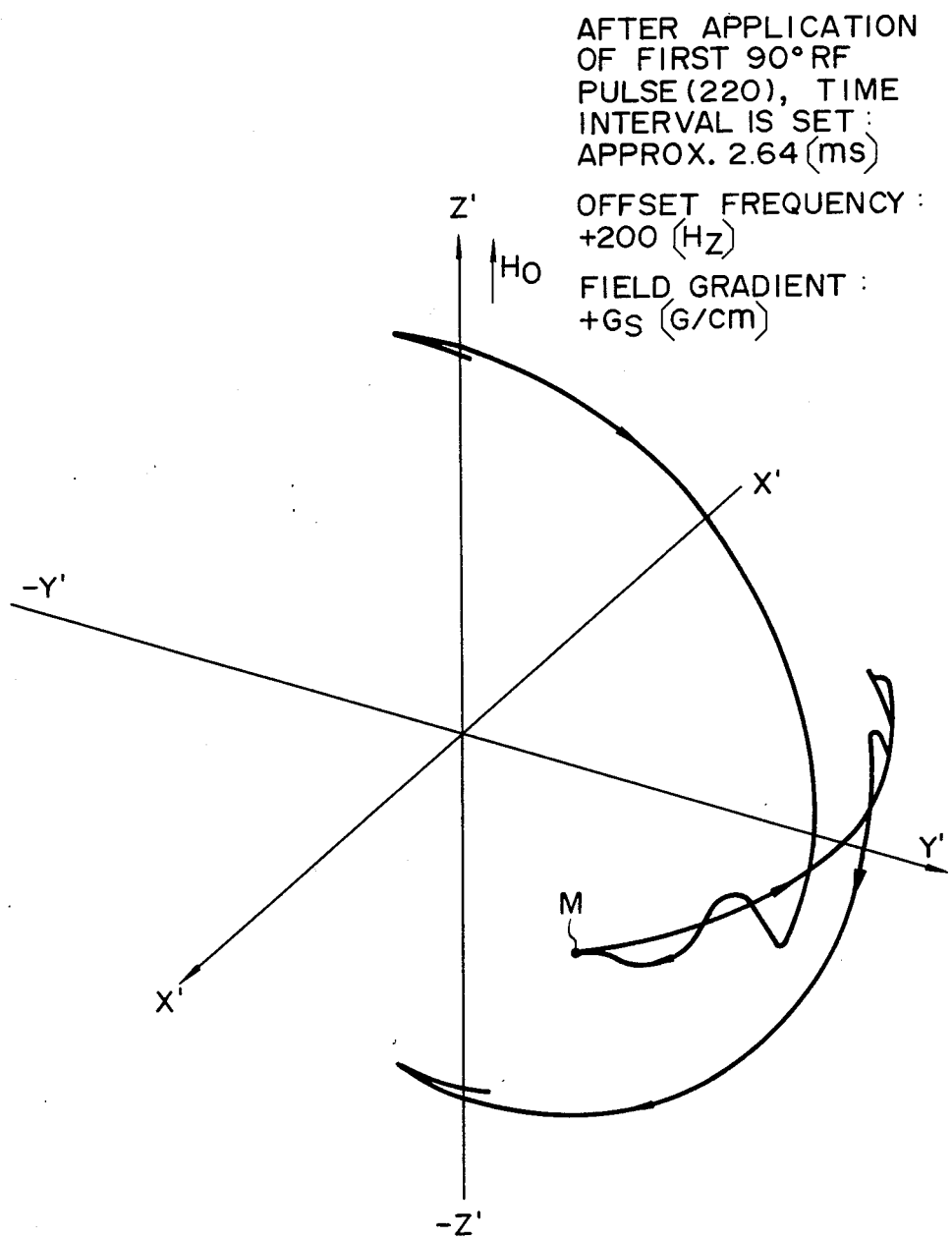

Referring back to FIG. 2, composite pulse 200 is obtained by two selective 90° RF pulses 220 and 240 under gradient $G_S$ so as to apply the characteristics of composite pulse 300 to the multi-slice method. In FIG. 2, the duration time of each pulse 220 or 240 is given as t0, and an inversion time interval of $(1.03 \times t0)$ required for inverting gradient $G_S$ is provided between the first and second pulse application times t0. If the peak time of each selective RF pulse 220 or 240 is given as 0, and t, $m_{X'}$ and $m_{Z'}$ given in equations (1) to (3) are substituted by $-t$, $-m_{X'}$ and $-m_{Z'}$, then equations (1) to (3) are valid, since $\omega_1(t)$ is equal to $\omega_1(-t)$. Magnetization vector M lying in the X'-Y' plane by pulse 220, as shown in FIG. 6, is converged by the inverted magnetic field gradient along the Y'-axis. The converged magnetization is then moved to a position symmetrical about the Y'-axis. The polarity of the magnetic field gradient is inverted again and second selective 90° RF pulse 240 is applied to the object. Therefore, the magnetization vector M can be inverted to the position of $-Z$, as shown in FIG. 7. In FIGS. 6 and 7, the offset frequency is about +200 Hz. The magnetization vector M cannot be completely converged onto the Y' axis by the inverted magnetic field gradient $G_S$. Moreover, the magnetization vector M cannot be completely inverted by selective 90° RF pulses 220 and 240 in the X'-Y' plane. However, if the deviation from the completeness is small, the same effects as described for the other composite RF pulse 300 can be obtained.

CHARACTERISTIC CURVE

Figure 8:
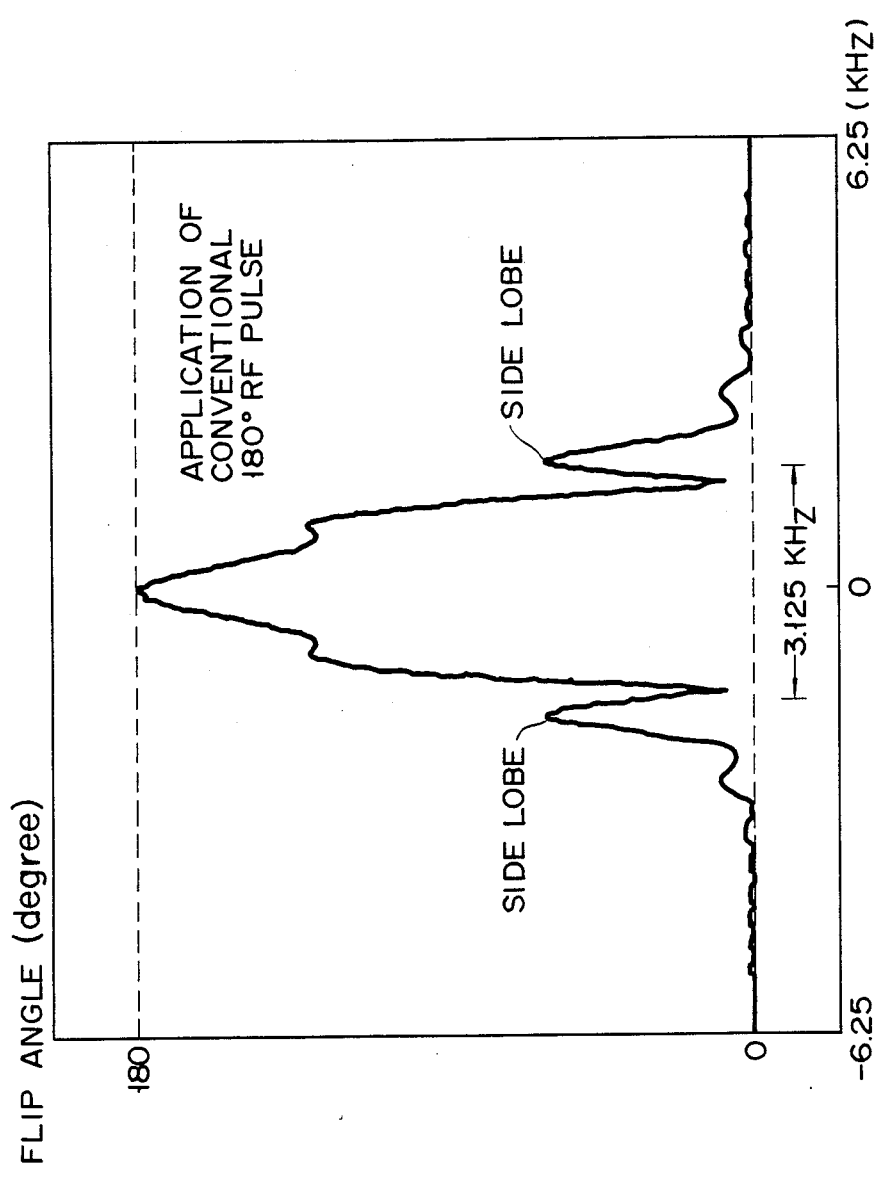
FIG. 8 is a graphic representation of the conventional flip angle distribution.
Figure 9:
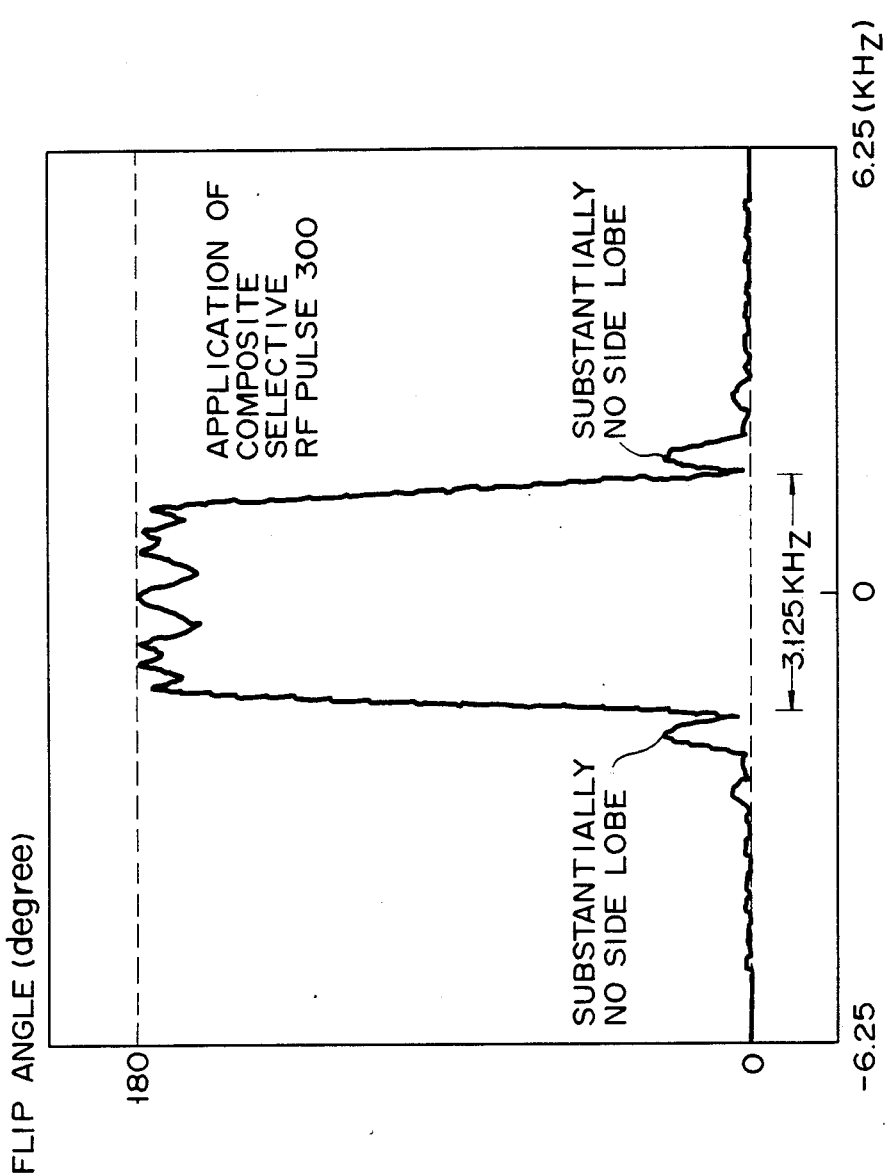
FIGS. 9 and 10 are graphic representations of the flip angle distributions according to the invention.
Figure 10:
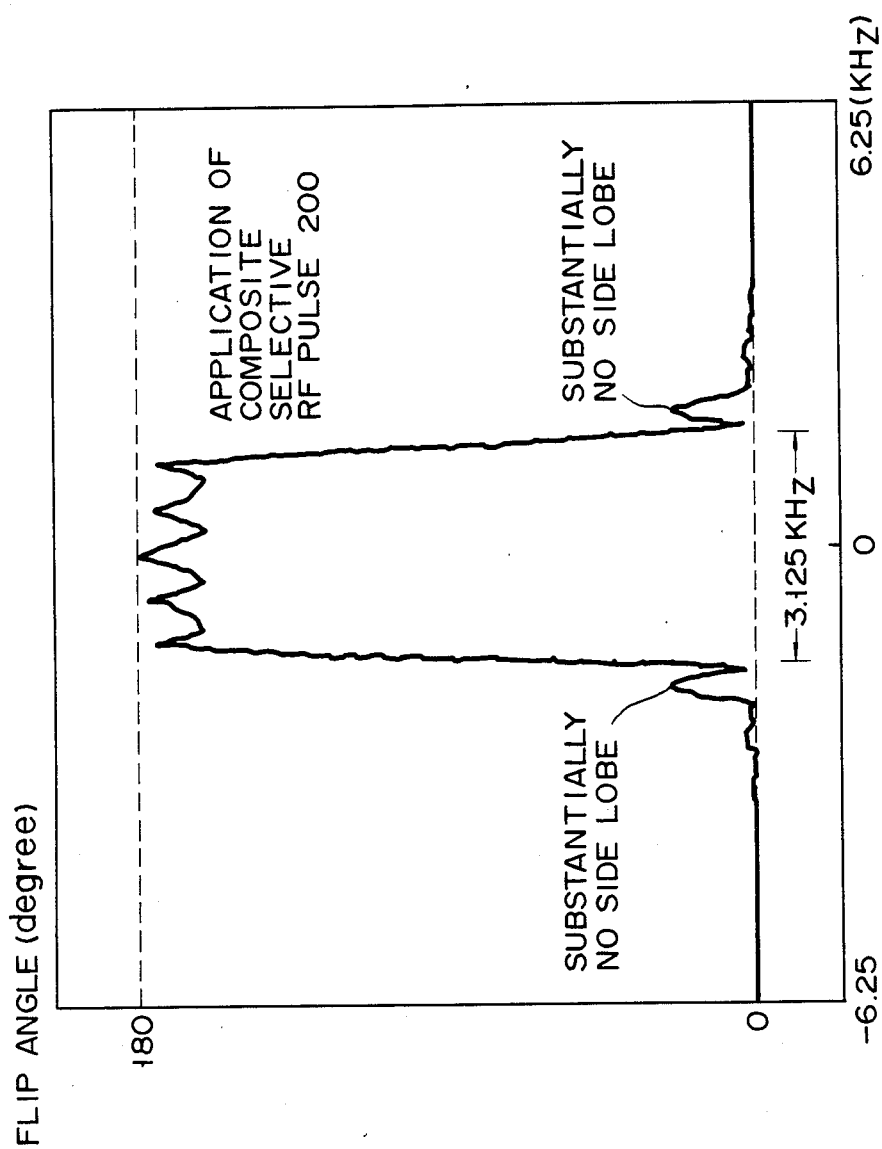

Flip angle (angles formed between the magnetization vector and the Z-axis) distributions obtained upon application of various types of selective composite RF pulses according to the present invention to a specific slice of the object are illustrated in FIGS. 8 to 10. It is obvious that the field gradient $G_S$ as well as the static field $H_0$ are being applied to this specific slice when the above selective composite RF pulses are applied thereto, so that nuclei of the specific slice are excited by the RF pulses under the influence of the combined fields $H_0$ and $G_S$. These distribution characteristics are called selective magnetization inversion characteristics. FIG. 8 shows the selective magnetization inversion characteristics obtained when the conventional selective 180° RF pulse is applied to the specific slice of the object. In this example, the uniformity of 180° inversion of the magnetization vector within a 3.125-kHz bandwidth determined by the pulse width is insufficient. In addition, large side lobes occur outside the bandwidth.

FIGS. 9 and 10 respectively show the selective magnetization inversion characteristics when composite pulse 300 in FIG. 3B and composite pulse 200 (for multislice) in FIG. 2 of the present invention are applied to the specific slice of the object. It can be seen from FIGS. 9 and 10 that substantially 180° magnetization inversion can be achieved within the 3.125-kHz bandwidth. In addition, side lobes outside the bandwidth are small, and their range is narrow, thus providing the advantages previously mentioned.

Figure 11:
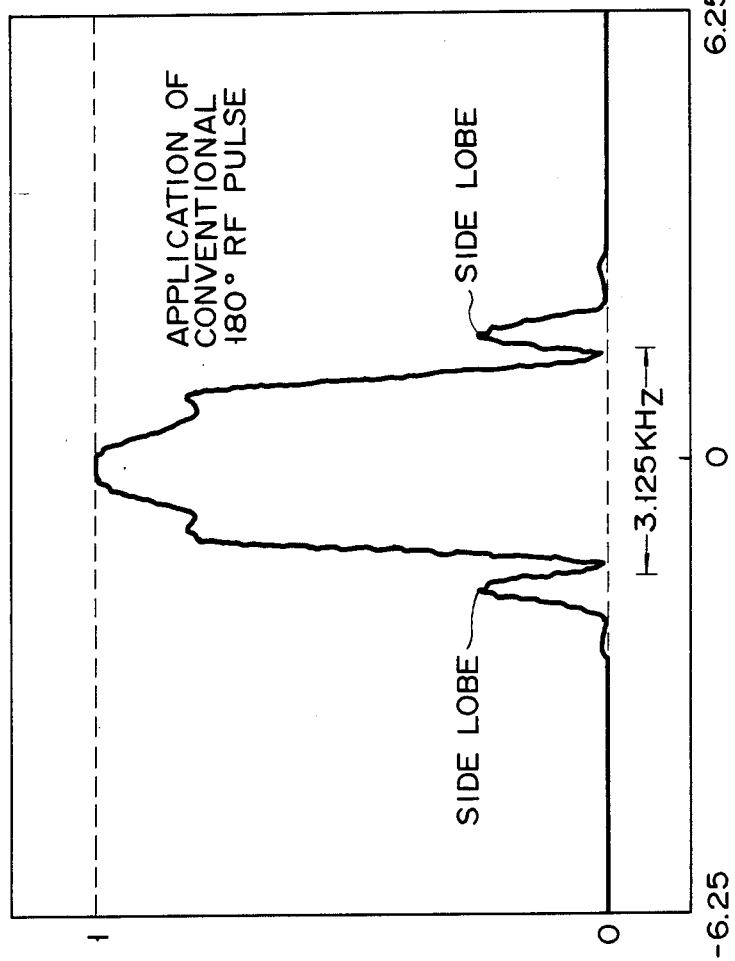
FIG. 11 is a graphic representation of the conventional focused moments characteristics.
Figure 12:
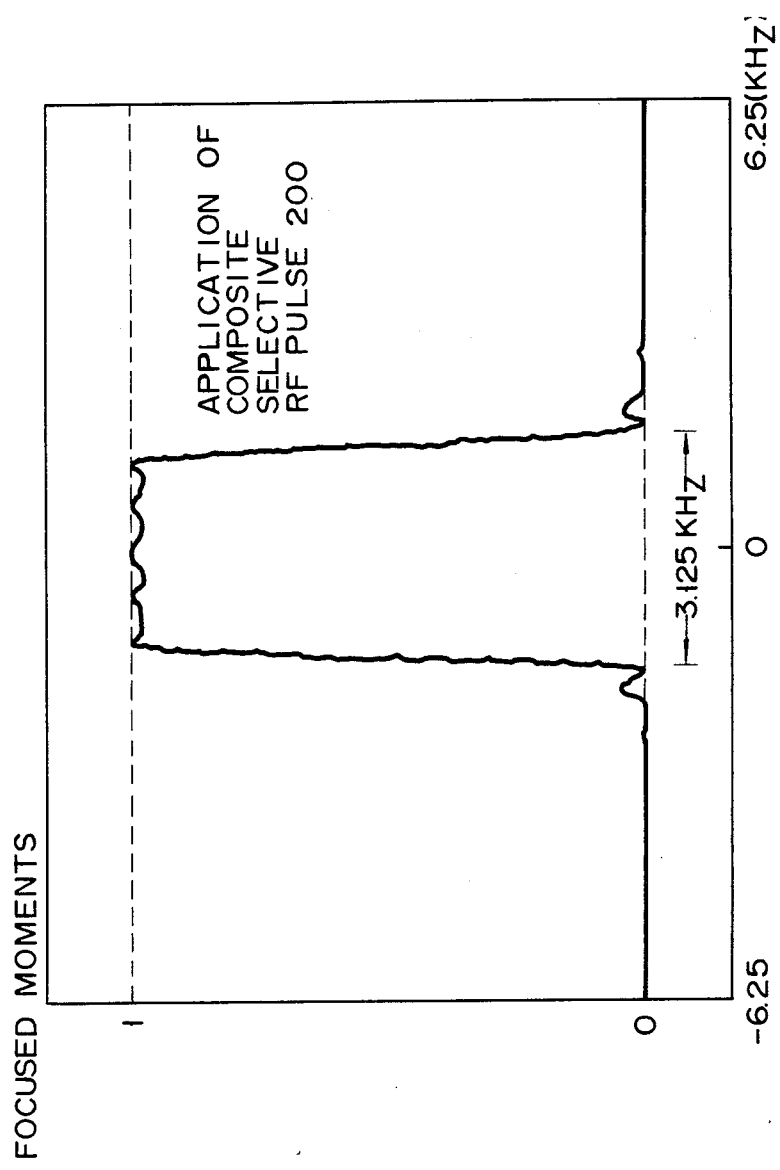
FIG. 12 is a graphic representation of the focused moments characteristics according to the invention.

In order to realize the multi-slice method, the conventional selective 180° RF pulse has problems such as the selective magnetization inversion characteristics as described above, and focus characteristics obtained by focusing the magnetization excited only within the specific slice as echoes. FIGS. 11 and 12 respectively show selective focused magnetic moment curves of echoes when the conventional single selective 180° RF pulse in FIG. 3A and when composite pulse 200 (FIG. 2) of the present invention are used. It is assumed that magnetization motion due to a nonuniform static field between the pulse duration times $t_0$ is negligible. As is apparent from FIGS. 11 and 12, only 70% of the magnetization within the 3.125-kHz bandwidth can be focused for the conventional single pulse. However, substantially 100% of the magnetization can be focused for the composite pulse of this embodiment.

According to the present invention, a composite selective RF pulse can be applied to any one of systems for performing magnetization excitation and echo signal convergence after 180° magnetization inversion is performed, and also to systems for performing magnetization excitation and echo signal convergence without 180° magnetization inversion.

According to the present invention, the composite selective RF pulse is used in place of the single selective 180° RF pulse to decrease a gap between successive slices in the multi-slice imaging method. This composite selective RF pulse can be also utilized to the single slice imaging method. The level of the acquired echo signal can be increased to obtain an inversion recovery image having high image quality. The overall operation of the present invention can be also understood from the claimed methods.

While the invention has been described in terms of certain preferred embodiments, and exemplified with respect thereto, those skilled in the art will readily appreciate that various modifications, changes, omissions, and substitutions may be made without departing from the spirit of the invention.

For instance, in the first composite selective RF pulse 200, the time interval between the first and second 90° RF pulses 220 and 240 was selected to be 1.03 $t_0$, "$t_0$" being the duration time of each 90° RF pulse.

It is also possible to select this time interval freely if the following conditions are maintained. That is, if the integrated area defined by the time interval and the strength of the gradient $G_S$ is kept constant, any combination of the time interval and the gradient strength is selectable.

Accordingly, when the gradient strength is selected to be two times higher than that of FIG. 2, the duration time of the 90° RF pulse 220 or 240, i.e., the interval time is ½ $t_0$.

Furthermore, in the previous embodiments, the static magnetic field was applied to the object along its longitudinal axis. However, it is, of course, possible to apply it along its transverse axis.

What is claimed is:

1. An imaging apparatus for producing a twodimensional image of an object under medical examination by nuclear magnetic resonance, comprising:
   first field means for applying a static magnetic field to said object;
   second field means for applying to said object a first magnetic field gradient that, in conjunction with said static magnetic field, defines a slice of said object, and for applying to said slice a second magnetic field gradient so as to produce positional information on nuclear magnetic resonance signals;
   means for producing a first 90° RF pulse and a composite selective RF pulse as a series of RF pulses, said composite selective RF pulse including second and third 90° RF pulses having the same pulse shape and pulse duration;
   probe head coil means for applying said series of RF pulses to at least said slice so as to excite specified nuclei therein, and for detecting the nuclear magnetic resonance signals derived from said slice; and
   means for controlling an application sequence of said series of RF pulses so as to apply said composite selective RF pulse after said first 90° RF pulse has been applied to said slice, said means firstly applying said second 90° RF pulse to said slice under a first polarity of said first field gradient and secondly applying said third 90° pulse to the same under said first polarity of said first gradient after a time interval under a second polarity of said first field gradient, opposite to said first polarity thereof, an integration value of said first field gradient being a predetermined value with reference to said time interval, and for reconstructing the two-dimensional image of the spatial distribution of the specified nuclei within said slice.

2. An apparatus as claimed in claim 1, wherein each of said second and third 90° RF pulses is produced by modulating a radio frequency signal with a SINC function.

3. An apparatus as claimed in claim 1, wherein said time interval is longer by 1.03 than the pulse duration of one of said second and third 90° RF pulses under the same field strength as that of said field gradient having the first polarity.

4. A method for imaging a two-dimensional image of an object under medical examination by nuclear magnetic resonance, comprising the steps of:
   applying a static magnetic field to said object;
   applying to said object a first magnetic field gradient that, in conjunction with said static magnetic field, defines a slice of said object, and
   applying to said slice a second magnetic field gradient for producing positional information on nuclear magnetic resonance signals;
   producing a first 90° RF pulse and a composite selective RF pulse as a series of RF pulses, said composite selective RF pulse including second and third 90° RF pulses having the same pulse shape and pulse duration;
   applying said series of RF pulses to at least said slice so as to excite specified nuclei therein, and detecting the nuclear magnetic resonance signals derived from said slice; and
   controlling an application sequence of said series of RF pulses so as to apply said composite selective RF pulse after said first 90° RF pulse has been applied to said slice, said controlling step being performed by firstly applying said second 90° RF pulse to said slice under a first polarity of said first field gradient and by secondly applying said third 90° pulse to the same under said first polarity of said first gradient after a time interval under a second polarity of said first field gradient, opposite to said first polarity thereof, an integration value of said first field gradient being a predetermined value with reference to said time interval; and
   reconstructing the two-dimensional image of the spatial distribution of the specified nuclei within said slice.

5. A method as claimed in claim 4, wherein each of said second and third 90° RF pulses is produced by modulating a radio frequency signal with a SINC function.

6. A method as claimed in claim 4, wherein said time interval is longer by 1.03 than the pulse duration of one of said second and third 90° RF pulses under the same field strength as that of said field gradient having the first polarity.

* * * * *